United States Patent [19]
Shinohara et al.

[11] Patent Number: 5,804,973
[45] Date of Patent: Sep. 8, 1998

[54] CONTROL DEVICE IN AN ELECTRIC VEHICLE

[75] Inventors: Sadao Shinohara; Tetsurou Shimohira, both of Wako, Japan

[73] Assignee: Honda Giken Kogyo Kabushiki Kaisha, Tokyo, Japan

[21] Appl. No.: 728,196

[22] Filed: Oct. 10, 1996

Related U.S. Application Data

[63] Continuation of Ser. No. 673,179, Jun. 26, 1996, abandoned.

[30] Foreign Application Priority Data

Jun. 27, 1995 [JP] Japan ................................ 7-16049495

[51] Int. Cl.⁶ .................................................. G01R 31/02
[52] U.S. Cl. .......................................... 324/548; 324/537
[58] Field of Search ................................... 324/537, 548, 324/678; 320/1

[56] References Cited

U.S. PATENT DOCUMENTS

| | | | |
|---|---|---|---|
| 4,425,541 | 1/1984 | Burkum et al. | 324/548 |
| 5,068,640 | 11/1991 | Burger et al. | 324/548 X |
| 5,294,889 | 3/1994 | Heep et al. | 324/678 |
| 5,369,540 | 11/1994 | Konrad et al. | 361/6 |
| 5,497,095 | 3/1996 | Ueyama et al. | 324/537 |
| 5,602,487 | 2/1997 | Manku | 324/678 |

FOREIGN PATENT DOCUMENTS 4-165901  6/1992  Japan.

*Primary Examiner*—Glenn W. Brown
*Attorney, Agent, or Firm*—Nikaido, Marmelstein, Murray & Oram LLP

[57] ABSTRACT

Before a motor contactor is turned ON, a pre-charge contactor is turned ON to charge a smoothing capacitor of an inverter. During this time, an increased rate of voltage of the capacitor is detected by a voltage sensor. When the increased rate exceeds a predetermined value, it is determined that the capacitor has deteriorated. After turning-OFF the motor contactor, a discharge contactor is turned ON, and the capacitor of the inverter is discharged. During this time, a decreased rate of voltage of the capacitor is detected by the voltage sensor. When the decreased rate exceeds a predetermined value, it is determined that the capacitor has deteriorated. Thus, it is possible to determine the deterioration of the smoothing capacitor mounted in the inverter in an electric vehicle without removing of the capacitor from the inverter.

18 Claims, 5 Drawing Sheets

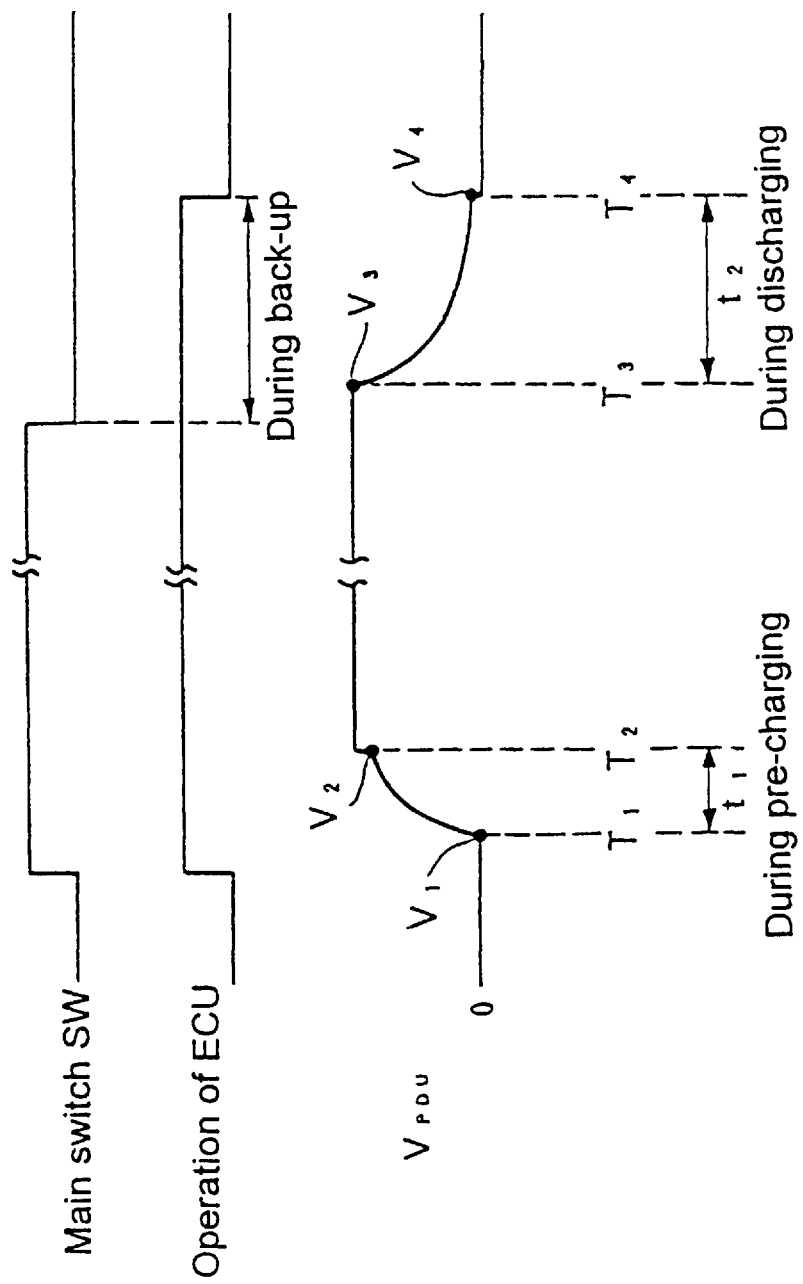

CONTROL DEVICE IN AN ELECTRIC VEHICLE

This application is a continuation of application Ser. No. 08/673,179 filed on Jun. 26, 1996, now abandoned.

BACKGROUND OF THE INVENTION

1. Field of the Invention

The present invention relates to a capacitor deterioration determining system in an electric vehicle. The electric vehicle includes a battery, an inverter for converting a DC current which is output by the battery into an AC current, a traveling motor driven by the AC current output by the inverter, and a capacitor connected in parallel to the inverter.

2. Description of the Related Art

An electrolytic capacitor smooths a variation in voltage in order to stabilize the operation of an inverter in an electric vehicle. In a known technique, the electrolytic capacitor is mounted between input terminals of the inverter (see U.S. Pat. No. 5,369,540 and Japanese Patent Application Laid-open No.4-165901).

The life expectancy of the capacitor varies depending upon the operational state of the motor. For example, if a high voltage is applied to the capacitor due to an abnormality of a regenerative operation, a deteriorating phenomenon such as a leakage of a fluid, a reduction in capacity or the like develops, and results in a shortened life expectancy. Therefore, conventionally the capacitor is removed from the inverter and the capacity of the capacitor is measured, thereby determining the life expectancy of the capacitor.

In the above conventional technique, however, periodical removal of the capacitor from the inverter to determine the life expectancy thereof is a troublesome task.

SUMMARY OF THE INVENTION

Accordingly, it is an object of the present invention to determine the life expectancy of the capacitor without removing the capacitor from the inverter.

To achieve the above object, according to the present invention, there is provided a capacitor deterioration determining system in an electric vehicle which includes a battery, an inverter for converting a DC current output by the battery into an AC current, a traveling motor driven by the AC current output by the inverter, and a capacitor connected in parallel to the inverter. The capacitor deterioration determining system comprises a charging device for charging the capacitor, a voltage detecting device for detecting a voltage of the capacitor, and a deterioration determining device for determining the deterioration of the capacitor based on a variation in the voltage of the capacitor detected by the voltage detecting device during operation of the charging device.

With such an arrangement, when the uncharged capacitor is charged by the charging device, the voltage of the capacitor is detected by the voltage detecting device. The deterioration of the capacitor is determined based on the variation in voltage of the capacitor. Therefore, it is possible to determine the deterioration of the capacitor without removing the capacitor from the inverter, which leads to an enhanced functionality.

In addition, according to the present invention, there is provided a deterioration determining system in an electric vehicle which includes a battery, an inverter for converting a DC current output by the battery into an AC current, a traveling motor driven by the AC current output by the inverter, and a capacitor connected in parallel to the inverter. The capacitor deterioration determining system comprises a discharging device for discharging the capacitor, a voltage detecting device for detecting a voltage of the capacitor, and a deterioration determining device for determining the deterioration of the capacitor based on a variation in the voltage of the capacitor detected by the voltage detecting device during operation is of the discharging device.

With the above arrangement, when the charged capacitor is discharged by the discharging device, the voltage of the capacitor is detected. The deterioration of the capacitor is detected by the deterioration determining device based the variation in voltage of the capacitor.

Therefore, it is possible to determine the deterioration of the capacitor without removing the capacitor from the inverter, which leads to an enhanced functionality.

The above and other objects, features and advantages of the invention will become apparent from the following description of the preferred embodiment taken in conjunction with the accompanying drawings.

BRIEF DESCRIPTION OF THE DRAWINGS

FIG. 5 is a graph for explaining the operation.

DETAILED DESCRIPTION OF THE PREFERRED EMBODIMENTS

Figure 1:
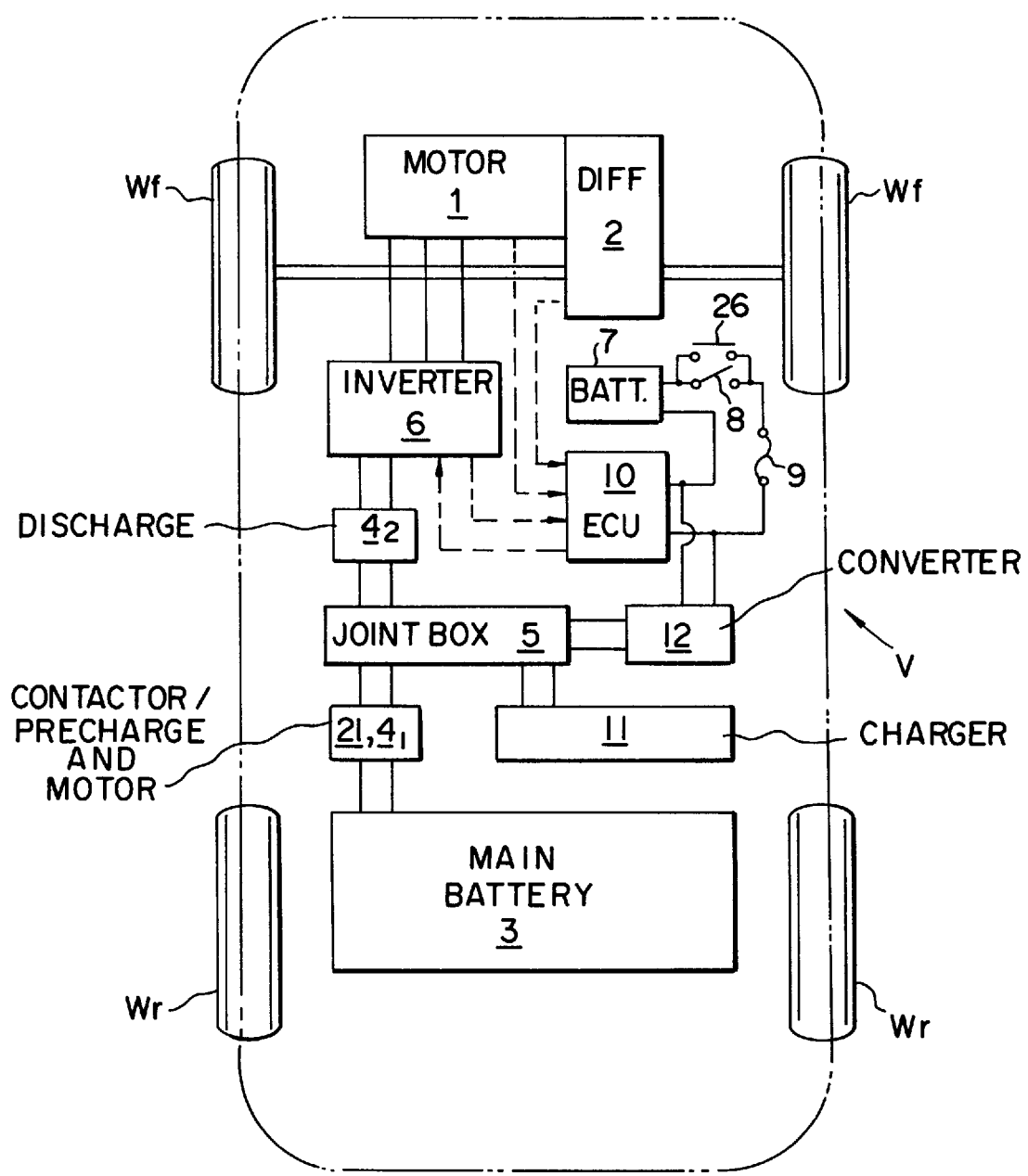
FIG. 1 is a diagrammatic illustration of the entire arrangement of an electric vehicle including a capacitor deterioration determining system according to an embodiment of the present invention.
Figure 2:
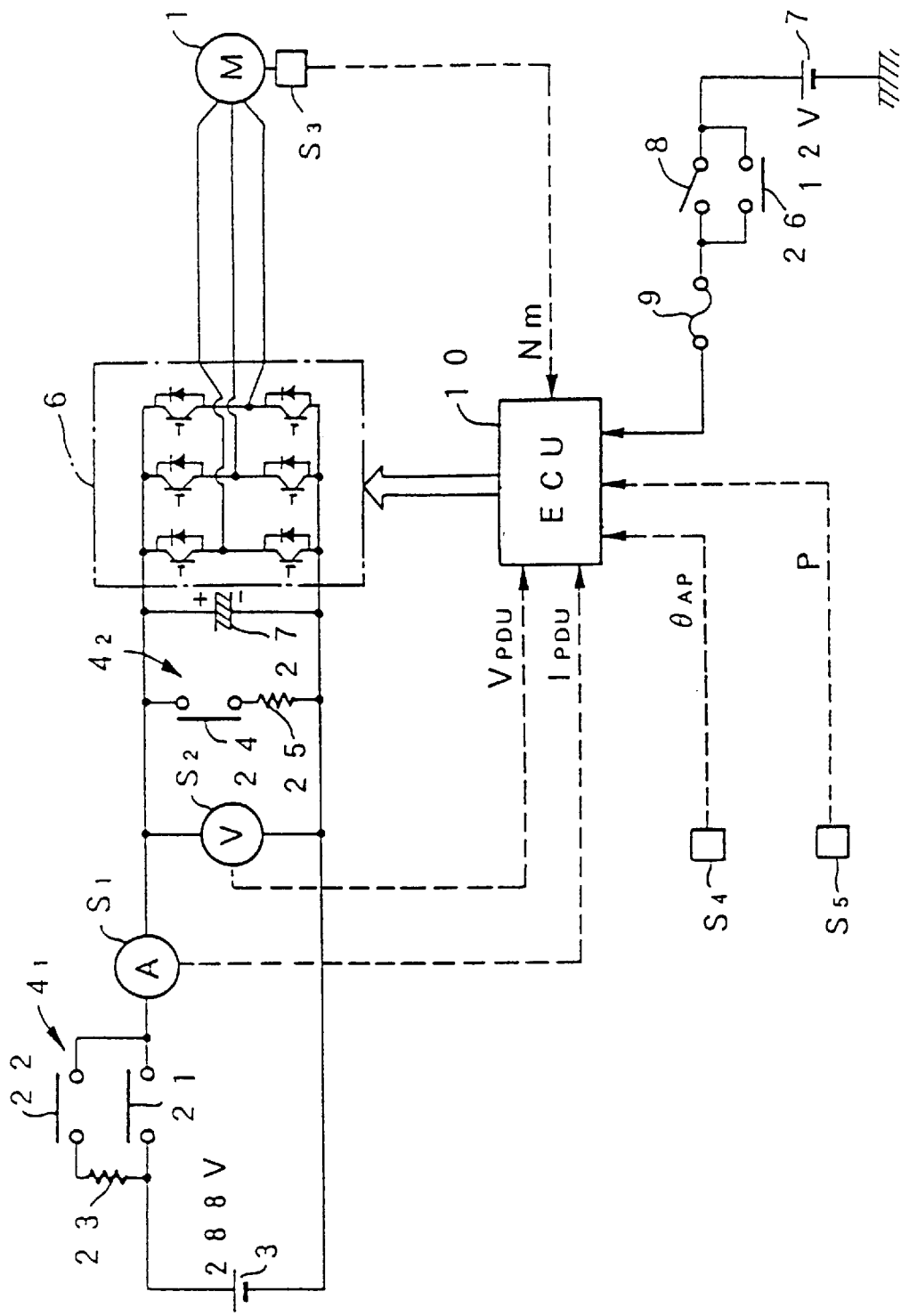
FIG. 2 is a block diagram of a control section.

Referring to FIGS. 1 and 2, a four-wheel electric vehicle V includes a pair of left and right front wheels Wf, Wf as driven wheels to which a torque of a three-phase AC motor 1 is transmitted through a differential 2, and a pair of left and right rear wheels Wr, Wr as follower wheels. A main battery 3, for example, of 288 volts is mounted at a rear portion of the electric vehicle V and connected to the motor 1 through a motor contactor 21, a pre-charging circuit $4_1$, a joint box 5, a discharging circuit $4_2$, and an inverter 6 constituting a power drive unit. An electronic control unit 10 is connected to a subsidiary battery 7, for example, of 12 volts through a main switch 8 and a fuse 9. The electronic control unit 10 is also connected to the inverter 6 to control the driving torque and the regenerative torque of the motor. To charge the subsidiary battery 7 with power from the main battery 3, a battery charger 11 and a DC/DC converter 12 are mounted in the vehicle.

The pre-charging circuit $4_1$, connected in parallel to the motor contactor 21, includes a pre-charging contactor 22 and a pre-charge resistor 23 which are connected in series to each other. -The discharging circuit $4_2$ includes a discharging contactor 24 and a discharging resistor 25 which are connected in series to each other. Further, a back-up contactor 26 is connected in parallel to the main switch 8.

The electronic control unit 10 constitutes a deterioration determining means of the present invention, and the pre-charging circuit $4_1$ and the discharging is circuits $4_2$ constitute a charging means and a discharging means of the present invention, respectively.

A current sensor $S_1$ for detecting an electric current $I_{PDU}$ and a voltage sensor $S_2$ for detecting a voltage $V_{PDU}$ are provided in a DC section which connects the main battery 3 and the inverter 6. The electric current $I_{PDU}$ in the DC section of the inverter 6 detected by the current sensor $S_1$ and the voltage $V_{PDU}$ in the DC section of the inverter 6 detected by the current sensor $S_2$ are input to the electronic control unit 10. A motor revolution-number Nm detected by a motor revolution-number sensor $S_3$, an accelerator opening degree $\Theta_{AP}$ detected by an accelerator opening degree sensor $S_4$ and a shift position P detected by a shift position sensor $S_5$ are input to the electronic control unit 10.

The inverter 6 includes a plurality of switching elements. By inputting a switching signal to each of the switching elements, the DC power of the main battery 3 is converted into a three-phase AC power and supplied to the motor. During non-driving of the motor 1 (i.e., during a regenerative operation), the three-phase AC power generated by the motor 1 is converted into a DC power and supplied to the main battery during driving of the motor 1. A smoothing capacitor 27, comprised of an electrolytic capacitor, is mounted between a high potential input terminal and a low potential input terminal of the inverter 6. Voltages during charging and discharging of the capacitor 27 are detected by the voltage sensor $S_2$.

In a low number of revolutions region of the motor is 1, the inverter 6 is subjected to a PWM (pulse width modulation) control. In a high number of revolutions region after the duty rate of the PWM control has reached 100%, the inverter 6 is subjected to a so-called field weakening control. The field weakening control is to reduce the entire field to increase the number of revolutions of the motor 1 to a larger value, wherein a primary electric current to be supplied to the motor 1 is provided with field electric current components, so that a field is generated in an opposite direction from a field generated by a permanent magnet of the motor 1.

Figure 3:
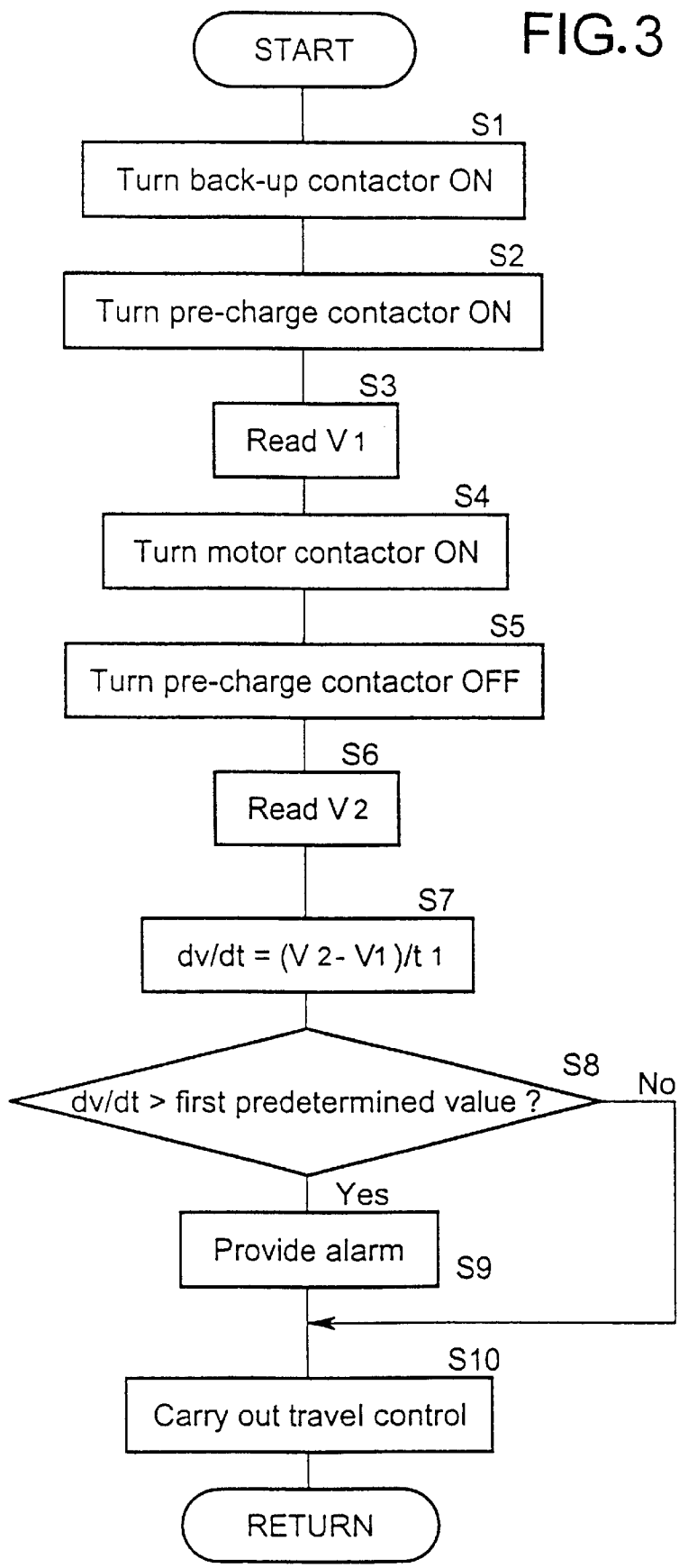
FIG. 3 is a flow chart for explaining the operation during charging.

The operation during charging of the capacitor 27 will be described with reference to FIGS. 3 and 5.

First, when the main switch 8 is turned ON at a time T=0, the back-up contactor 26 is turned ON, bringing the electronic control unit 10 into an operative state (at step S1). At a time T=$T_1$, the pre-charge contactor 22 is turned ON, thereby permitting an electric current to flow from the main battery 3 through a pre-charge resistor 23 to the capacitor 27 to start the charging of the capacitor 27 (at step S2). At the same time the pre-charge contactor 22 is turned ON, a voltage $V_1$ in the capacitor 27 is detected by the voltage sensor $S_2$ (at step S3).

At a time $T_2$ after a lapse of a predetermined time $t_1$ from the turning-ON of the pre-charge contactor 22, the motor contactor 21 is turned ON (at step S4) and at the same time, the pre-charge contactor 22 is turned OFF (at step S5). Then, at the same time the pre-charge contactor 22 is turned OFF, a voltage $V_2$ in the capacitor 27 is detected by the voltage sensor $S_2$ (at step S6). The predetermined time $t_1$ is set shorter than a time within which the charging of the capacitor 27 is completed.

Then, a variation rate dV/dt of the voltage of the capacitor 27 within the preset time $t_1$ is calculated according to the following equation (at step S7):

$$dV/dt = (V_2 - V_1)/t_1$$

If the variation rate dv/dt is larger than a first predetermined value (at step S8), i.e., a rate of increase in the voltage during charging of the capacitor 27 is large, then it is determined that a capacitor capacity C has been decreased due to a decrease in a time constant (i.e., a decrease in a product of the capacitor capacity C and the pre-charge resistance R). Thus, it is determined that the capacitor 27 has deteriorated, thereby providing an alarm or warning by a lamp or a buzzer (at step S9).

A travel control which is normally carried out and will be described below, is carried out at step S10.

A torque command value for a torque, which is to be generated in the motor 1 by a driver means, is determined by searching a prestored map, based on the motor revolution-number Nm detected by the motor revolution-number sensor $S_3$, the accelerator opening degree $\Theta_{AP}$ detected by the accelerator opening degree sensor $S_4$ and the shift position P detected by the shift position sensor $S_5$. The torque command values include a driving torque command value, and a regenerative torque command value. The driving torque command value is for generating a driving torque in the motor 1, and the regenerative command value is for generating a regenerative torque in the motor 1. Then, a target power, to be supplied to the motor 1 or to be taken out of the motor 1 by the regenerative operation, is calculated by multiplying the torque command value by the motor revolution-number Nm detected by the motor revolution-number sensor $S_3$ and dividing the resulting value by a converting efficiency. The target power may be a positive value in one instance and a negative value in another instance. The positive target power corresponds to when the motor 1 generates the driving torque 1, and the negative target power corresponds to when the motor 1 generates the regenerative torque.

An actual power input to the DC section of the inverter 6 is calculated by multiplying the current $I_{PDU}$, in the DC section of the inverter 6 detected by the current sensor $S_1$, by the voltage $V_{PDU}$ in the DC section of the inverter 6 detected by the voltage sensor $S_2$. Similar to the target power, the actual voltage may be a positive value in one instance and a negative value in another instance. The positive actual power corresponds to when the motor 1 generates the driving torque, and the negative value corresponds to when the motor 1 generates the regenerative torque.

A deviation between the target power and the actual power is calculated, and the motor 1 is subjected to the PWM control or the reducing field control through the inverter 6 in order to converge the deviation to zero.

Figure 4:
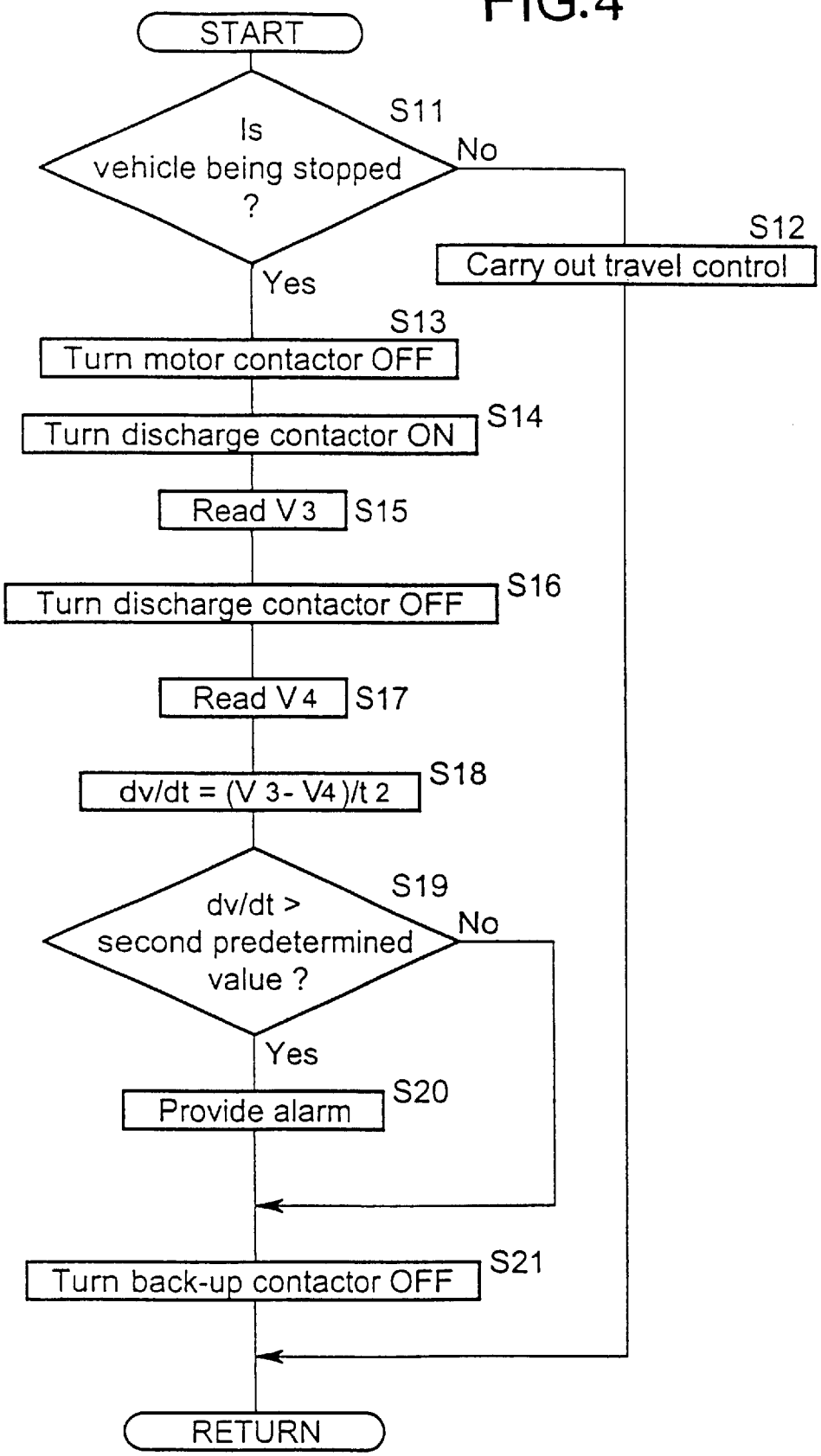
FIG. 4 is a flow chart for explaining the operation during discharging.

The operation during discharging of the capacitor 27 will be described with reference to FIGS. 4 and 5.

First, it is determined, base on the motor revolution-number Nm or a vehicle speed, whether the vehicle is stopped or is travelling, when the driver has turned the main switch 8 OFF (at step S11). If the vehicle is traveling, the above-described normal travel control is carried out (at step S12). Even if the main switch 8 has been turned OFF, the back-up contactor 26 is maintained in an ON state for a predetermined time and hence, the function of the electronic control unit 10 is maintained.

If it is determined at step S11 that the vehicle is stopped, the motor contactor 21 is turned OFF by the main switch 8 being turned OFF (at step S13). After the motor contactor 21 has been turned OFF, the discharge contactor 24 is turned ON at a time $T_3$ (at step S14) and at the same time, a voltage $V_3$ in the capacitor 27 is detected by the voltage sensor $S_2$ (at step S15)

An electric charge accumulated in the capacitor 27 is consumed by the discharge resistor 25 by turning the discharge contactor 24 ON. At a time $T_4$ after a lapse of a predetermined time period $t_2$ from the time $T_3$, the discharge contactor 24 is turned OFF (at step S16) and at the same time, a voltage $V_4$ in the capacitor 27 is detected by the voltage sensor $S_2$ (at step S17). The predetermined time $t_2$ is set shorter than the time within which the discharging of the capacitor 27 is completed.

Then, a variation rate dV/dt of the voltage in the capacitor 27 within the predetermined time $t_2$ is calculated according to the following equation (at step S18):

$$dV/dt = (V_3 - V_4)/t_2$$

If the variation rate dV/dt of the voltage is larger than a second predetermined value (at step S19), i.e., if a rate of voltage decrease during discharging of the capacitor 27 is large, it is determined that the capacitor capacity C has decreased due to a decrease in a time constant (i.e., a decrease in a product of the capacitor capacity C and a discharge resistance R). Thus, it is determined that the capacitor 27 has deteriorated, thereby providing an alarm or warning by a lamp or a buzzer (at step S20). At step S21, the function of the electronic control unit 10 is stopped by turning-OFF the back-up contactor 26.

The pre-charge resistor 23 and the discharge resistor 25 are different in resistance value from each other. Hence, the first predetermined value, used as a reference for the determination of-the deterioration during charging, and the second predetermined value, used as a reference for the determination of the deterioration during discharging, are discrete values.

As described above, the determination of the deterioration of the capacitor 27 can be performed in an on-board state without removing the capacitor 27 from the inverter 6. Hence, the time required for maintenance of the capacitor 27 can be substantially reduced.

Each of the pre-charging circuit $4_1$ and the discharging circuit 42 are of a simple structure using only the resistor. However, if they are each used as a constant-current circuit, it is possible to provide a further accurate determination without being influenced by the voltage of the main battery 3 and the like.

Although the embodiment of the present invention has been described in detail, it will be understood that the present invention is not limited to the above-described embodiment, and various modifications may be made without departing from the spirit and scope of the invention defined in the claims.

What is claimed is:

1. A control device in an electric vehicle, the control device including a battery, an inverter for converting a DC current output by the battery into an AC current, a traveling motor driven by the AC current output by the inverter, a capacitor connected in parallel to the inverter, and a control means for switching an operation of said inverter in response to a signal indicative of an operation of the electric vehicle, said control device further comprising:

a charging means for charging said capacitor;

a voltage detecting means for detecting a voltage of said capacitor; and a deterioration determining means for determining deterioration of said capacitor based on a variation in voltage of said capacitor detected by said voltage detecting means a) during operation of said charging means and b) prior to traveling of said electric vehicle.

2. A control device in an electric vehicle according to claim 1, wherein said charging means comprises a constant current circuit.

3. A control device in an electric vehicle according to claim 1, wherein said charging means comprises a pre-charge contactor and a pre-charge resistor.

4. A control device in an electric vehicle according to claim 3, wherein said pre-charge contactor is turned on after a lapse of a first predetermined time from when a main switch is turned on.

5. A control device in an electric vehicle according to claim 4, wherein when said pre-charge contactor is turned on, said voltage detecting means detects a first voltage of said capacitor.

6. A control device in an electric vehicle according to claim 5, wherein after a lapse of a second predetermined time from when said pre-charge contactor is turned on, said pre-charge contactor is turned off.

7. A control device in an electric vehicle according to claim 6, wherein said second predetermined time is shorter than a time to completely charge said capacitor.

8. A control device in an electric vehicle according to claim 6, wherein when said pre-charge contactor is turned off, said voltage detecting means detects a second voltage of said capacitor.

9. A control device in an electric vehicle according to claim 8, wherein said variation in voltage is based upon a) said first and second voltages detected by said voltage detecting means and b) said second predetermined time.

10. A control device in an electric vehicle, the control device including a battery, an inverter for converting a DC current output by the battery into an AC current, a traveling motor driven by the AC current output by the inverter, a capacitor connected in parallel to the inverter, and a control means for switching an operation of said inverter in response to a signal indicative of an operation of the electric vehicle, said control device further comprising:

a discharging means for discharging said capacitor;

a voltage detecting means for detecting a voltage of said capacitor; and a deterioration determining means for determining deterioration of said capacitor based on a variation in voltage of said capacitor detected by said voltage detecting means a) during operation of said discharging means and b) after traveling of said electric vehicle.

11. A control device in an electric vehicle according to claim 10, wherein said discharging means comprises a constant current circuit.

12. A control device in an-electric vehicle according to claim 10, wherein said discharging means comprises a discharging contactor and a discharging resistor.

13. A control device in an electric vehicle according to claim 12, wherein said discharge contactor is turned on when the vehicle is stopped and a main switch is turned off.

14. A control device in an electric vehicle according to claim 13, wherein when said discharge contactor is turned on, a first voltage of said capacitor is detected by said voltage detecting means.

15. A control device in an electric vehicle according to claim 14, wherein after a lapse of a predetermined time from when said discharge contactor is turned on, said discharge contactor is turned off.

16. A control device in an electric vehicle according to claim 15, wherein said predetermined time is shorter than a time to completely discharge said capacitor.

17. A control device in an electric vehicle according to claim 15, wherein when said discharge contactor is turned off, a second voltage of said capacitor is detected by said voltage detecting means.

18. A control device in an electric vehicle according to claim 17, wherein said variation in voltage is based upon a) said first and second voltages detected by said voltage detecting means and b) said predetermined time.

* * * * *

UNITED STATES PATENT AND TRADEMARK OFFICE
CERTIFICATE OF CORRECTION

PATENT NO. : 5,804,973

DATED : September 8, 1998

INVENTOR(S) : Shinohara et al.

It is certified that error appears in the above-identified patent and that said Letters Patent is hereby corrected as shown below:

Item [30], delete "7-16049495" insert therefor -- 7-160494 --

Signed and Sealed this

Twenty-ninth Day of December, 1998

Attest:

BRUCE LEHMAN

Attesting Officer          Commissioner of Patents and Trademarks